(12) United States Patent
Martin et al.

(10) Patent No.: US 11,658,272 B2
(45) Date of Patent: May 23, 2023

(54) LED MODULE WITH ADJUSTED EMISSION SPECTRUM

(71) Applicant: Zumtobel Lighting GmbH, Dornbirn (AT)

(72) Inventors: Kenneth Martin, Dornbirn (AT); Lukas Osl, Dornbirn (AT)

(73) Assignee: Zumtobel Lighting GmbH, Dornbirn (AT)

(*) Notice: Subject to any disclaimer, the term of this patent is extended or adjusted under 35 U.S.C. 154(b) by 0 days.

(21) Appl. No.: 17/417,823

(22) PCT Filed: Mar. 16, 2020

(86) PCT No.: PCT/EP2020/057124
§ 371 (c)(1),
(2) Date: Jun. 24, 2021

(87) PCT Pub. No.: WO2020/187840
PCT Pub. Date: Sep. 24, 2020

(65) Prior Publication Data
US 2022/0059731 A1    Feb. 24, 2022

(30) Foreign Application Priority Data

Mar. 18, 2019  (AT) .................. ATGM50038/2019
Jul. 10, 2019   (DE) .................. DE10 2019 118 664
Dec. 18, 2019  (EP) .................. EP19217282

(51) Int. Cl.
*H01L 33/50*    (2010.01)
*F21K 9/64*     (2016.01)
*F21Y 115/10*   (2016.01)

(52) U.S. Cl.
CPC .............. *H01L 33/502* (2013.01); *F21K 9/64* (2016.08); *F21Y 2115/10* (2016.08)

(58) Field of Classification Search
CPC ................................. F21K 9/64; H01L 33/502
See application file for complete search history.

(56) References Cited

FOREIGN PATENT DOCUMENTS

| DE | 10 22014 117 771 | 6/2015 |
|----|------------------|--------|
| EP | 3 316 321        | 5/2018 |
| EP | 3 364 470        | 8/2018 |

OTHER PUBLICATIONS

PCT Search Report dated Jun. 25, 2020 in parent application PCT/EP2020/0571024.
Allen, A. et al., "Form vision from melanopsin in humans", Nature Communications, https://doi.org/10.1038/s41467-019-10113-3, 2019, 10 pages.
Spitschan, M., "Melanopsin contributions to non-visual and visual function", Current Opinion in Behavioral Sciences 2019, 30:67-72.

*Primary Examiner* — Karabi Guharay
(74) *Attorney, Agent, or Firm* — Andrus Intellectual Property Law, LLP

(57) ABSTRACT

The present invention relates to an LED module (100), comprising: an LED chip (102), which is embodied to emit electromagnetic radiation, at least one phosphor (104), which is suitable for converting the radiation from the LED chip (102) into light, wherein an emission spectrum of the LED module (100) contains a blue light component and a green light component, wherein an intensity of the blue light component is greater than a CIE intensity at the same color temperature, and wherein an intensity of the green light component is less than a CIE intensity at the same color temperature.

20 Claims, 6 Drawing Sheets

LED MODULE WITH ADJUSTED EMISSION SPECTRUM

CROSS REFERENCE TO RELATED APPLICATIONS

The present application is the U.S. national state application of International Application PCT/EP2020/057124 filed Mar. 16, 2020, which international application was published on Sep. 24, 2020 as International Publication WO 2020/187840 A1. The international application claims priority to Austria Patent Application GM50038/2019 filed Mar. 18, 2019; German Patent Application 10 2019 118 664.1 filed Jul. 10, 2019; and European Patent Application 19217282.3 filed Dec. 18, 2019.

FIELD OF THE INVENTION

The present invention relates to an LED module for generating an emission spectrum, especially an LED module or LED lamp emitting mixed-colored light or white light.

BACKGROUND OF THE INVENTION

LEDs whose emission spectrum is composed following a target compromise are known from the prior art. This compromise consists in achieving the maximum light output at a defined minimum color rendering level, e.g., >80, >90, or even >97.

The maximum high color reproduction by definition for all conceivable test objects would have an emission spectrum which corresponds to the reference light spectrum at the same correlated color temperature and the same luminous flux.

In this case, according to the CIE recommendation, a Planckian emission spectrum is used as reference light spectrum at correlated color temperatures (CCTs) of less than 5000 K, or in the case of higher CCTs a CIE standard daylight spectrum of the same CCT is however used.

The same methodology was used in the IES TM-30-15 standard and division was also carried out at 5000 K. However, this was changed in the 2018 updated version TM-30-18; a division at 4000 K is defined here (above it daylight spectra, below it Planckian emission spectra).

For a maximum light output, ranges of the emission spectrum which are less important for the color fidelity of the illuminated test colors (pastel tone defined in CRI 8) are omitted in the emission. With this approach, emission spectra are optimized for target color reproduction and maximum efficiency. The resulting emission spectra are as a rule generated by mixing the color emitted from a blue component at approximately 450 nm with further color components of longer wavelengths.

The said blue component emits predominantly in the wavelength range in which the short-wavelength-sensitive blue receptors of the human eye have approximately their maximum sensitivity and is thus as a rule generated by blue-emitting LED chips that have been optimized at a wavelength of approximately 450 nm for maximum efficiencies. One or more phosphors are also generally excited by a part of this light from the LED chips to emit colors of greater wavelengths from cyan to red.

The density of the phosphors in the light path in front of the short-wavelength-emitting LED is set materially in such a way that only a defined portion of short-wavelength blue light and a defined portion of the other colors are emitted in total or at least in a specific direction, and a light spectrum is thus generated which comes relatively close to the target color-temperature reference light spectrum.

In this case, however, an azure-blue portion that is important for non-visual effects on humans is typically omitted because this portion cannot be generated highly efficiently with current phosphors when excited by blue light and which additionally would need a stronger orange-red portion as a counterpole for the correct target color temperature and the correct white target chromaticity point, which orange-red portion, however, would reduce the luminous flux efficiency (the value of the photometric radiation equivalent of the emission spectrum) and thus, as a result, also the light output.

Moreover, artificial light spectra, which have distinct intensity deviations in the form of peaks in comparison to light spectra of natural light sources, are to be critically considered because with different individual cell sensitivities, could randomly have very different and possibly previously unresearched visual or non-visual effects via the individual cells or individuals (humans) due to the position of the peaks.

The aim is therefore to artificially generate a light spectrum that is as continuous as possible, corresponding to natural light sources. The azure-blue portion is now increased in novel solutions with the direct emission of LED chips at approximately 465-485 nm, which, however, represents an additional level of complexity and thus makes the LED modules more expensive. In addition, a further peak to be considered critically is generated in the emission spectrum.

Alternatively, solutions with very short-wavelength chip emissions at 400-415 nm and corresponding blue phosphors and long-wavelength phosphors are produced, which however, due to the broad emission in the violet-blue range, likewise again accordingly require a strong red portion as counterbalance for the desired chromaticity point, which significantly reduces the light output as described above.

Due to the aforementioned target compromise, optimization generally always aims at an optimally good adaptation to the reference light spectra at the target color temperature.

The problem in this case is to achieve good adaptations to the reference light spectra at the target color temperature. Furthermore, the problem is that the light, which has a naturally activating effect on humans during the day, always has high color temperatures (starting from 5000 K upward to 16 000 K, scattered blue sky light in shadow), but warmer color temperatures (up to 5000 K, rarely higher) are usually used in indoor spaces for aesthetic reasons and out of habit.

The short-wavelength portions and above all the important azure-blue portions of natural light are thus significantly reduced at the typical color temperatures used in indoor lighting if, as was previously customary, the comparison is made at the same lighting values (lumens, candela, lux). According to more recent findings, the azure-blue portion, which is also referred to as a melanopic portion and for which a standardized eye-sensitivity curve has recently become available, has a significant effect on pupil diameter and on chemical brightness adaptation in the eye and thus on visual effects such as glare, contrast, visual clarity, etc.

As a result of this exceptional effect of the melanopic portion, the assumption is made for the present invention that a comparison of emission spectra with the same melanopic effect ("melanopic illuminance" or other) should be made.

In light of the described prior art, it is an object of the present invention to provide a novel emission spectrum which has a normally low color temperature for interiors and comes close to the daylight spectrum in wide ranges of the emission-spectral profile. An improvement in LED lighting is thus to be made possible.

These and other objects, which will be mentioned during reading of the following description or which can be recognized by a person skilled in the art, are achieved by the subject-matter of the independent claims. The dependent claims develop the central idea of the present invention in a particularly advantageous manner.

SUMMARY OF THE INVENTION

According to a first aspect, the present invention relates to an LED module, wherein the LED module comprises: an LED chip designed to emit a radiation, at least one phosphor suitable for converting the radiation of the LED chip into a light, wherein an emission spectrum of the LED module contains a blue light portion and a green light portion, wherein an intensity of the blue light portion is greater than a CIE intensity of the same color temperature, and wherein an intensity of the green light portion is less than a CIE intensity of the same color temperature.

This emission spectrum of the LED module has the advantage that it is optimized for visual and non-visual effects.

Furthermore, this emission spectrum of the LED module is similar to the daylight spectrum. The emitted light/spectrum thus contains natural physiological properties. This emission spectrum of the LED module is preferably similar to the daylight spectrum with higher CCT in an important spectral range.

Furthermore, the emission spectrum has a positive effect on human health, is particularly suitable for children, and meets current standards and regulations.

According to one embodiment, the at least one phosphor is designed to at least partially absorb the radiation of the LED chip and in light to emit in a different, especially greater, wavelength range than the radiation, wherein the emission spectrum of the LED module is generated by mixing the radiation of the LED chip and the light emitted by the phosphor.

This has the advantage that the radiation emitted by the LED chip, which can be, for example, in a blue or violet range, is converted into light (more) suitable for the human eye.

According to one embodiment, the LED module comprises a cover, especially a globe top, which contains the at least one phosphor.

The globe top can especially have the at least one phosphor added in and be arranged in the emission direction of the LED chip.

According to one embodiment, the LED chip emits the radiation in a violet wavelength range which in particular has no UV portion.

According to a WHO definition, UV (ultraviolet) is understood to mean the range just below 400 nm.

According to one embodiment, the emission spectrum of the LED module in a range from 460 nm to 550 nm, especially in a blue range, shows no upward outlying peak.

This means that at no wavelength will there be a sudden increase in intensity in this range. The intensity changes only moderately over this range. This has the advantage that the wavelengths acting for the human disadvantageously for individual human sensitivities cannot be dominant in the emission spectrum because their intensity is low (no peak (s)).

According to one embodiment, the emission spectrum of the LED module at a color temperature of 4000 K is, preferably in the crucially important spectral range of 460-550 nm, equal to a standardized daylight spectrum according to CIE of a higher color temperature.

This has the advantage that the light artificially generated by the LED module has a natural effect on humans (similar to daylight).

In the case of a CCT that is 1250 K to 1750 K lower than that of the compared natural light, the deviation from this natural emission spectrum in the emission spectral intensity in the range of 460-550 nm is, according to one example, at most ±15% at individual wavelengths.

At a specific color temperature, preferably 4000 K, the emission spectrum of the LED module 100 may be substantially equal to, preferably within 10% of, preferably within 5% of, a standardized daylight spectrum according to CIE of a correlated color temperature at least 1250 kelvin higher.

At the specific color temperature, the emission spectrum of the LED module 100 may be substantially equal to, preferably within 10% of, preferably within 5% of, a standardized daylight spectrum according to CIE of a correlated color temperature no more than 1750 kelvin higher.

The color temperature of the standardized daylight spectrum is preferably in the range of 5300 K to 6000 K, especially preferably 5700 K.

The emission spectrum of the LED module 100 at a color temperature of 4000 K according to an example is substantially equal to a standardized daylight spectrum according to CIE of a higher color temperature.

According to one embodiment, the emission spectrum of the LED module is in a green range, for example from 530 nm to 550 nm, at a color temperature of 4000 K, preferably close to the daylight spectrum at 5700 K.

According to one embodiment, an intensity of the emission spectrum in this wavelength range is below an intensity of the daylight spectrum at identical temperature, for example 4000 K.

According to one embodiment, a color rendering index (CRI) or Ra of the spectrum of the LED module is above 90.

According to one embodiment, the emission spectrum of the LED module is generated by a dye-converted LED containing the LED chip and the at least one phosphor.

A dye-converted LED thus comprises an LED chip which emits electromagnetic radiation and at least one phosphor which at least partially converts this radiation into different electromagnetic radiation/light.

According to one embodiment, the emission spectrum of the LED module is generated by combining a dye-converted LED, containing the LED chip and the at least one phosphor, and the optical properties of a lamp.

For example, the optical properties of the lamp reduce the violet portion of the LED chip or of the dye-converted LED.

According to one embodiment, an intensity of the radiation of the LED chip can be changed by amplitude or pulse-width modulation.

According to one embodiment, the wavelength of the radiation of the LED chip can be changed via a forward current or via its temperature.

According to one embodiment, a first emission peak of the emission spectrum of the LED module, which has a lower intensity than a second emission peak of the emission spectrum at approximately 460 nm, lies within a range from 410 nm to 430 nm.

According to one embodiment, a third emission peak of the emission spectrum is at approximately 605 nm, which third emission peak has a greater intensity than the first emission peak of the emission spectrum.

According to one embodiment, a third emission peak of the emission spectrum, which third emission peak has a lower or a greater intensity than the second emission peak of the emission spectrum, is at approximately 605 nm.

According to a second aspect, the present invention relates to a method for an LED module, comprising the following steps: emitting a radiation and converting (by means of at least one phosphor) the radiation of an LED chip of the LED module into a light, wherein an emission spectrum of the LED module contains a blue light portion and a green light portion, wherein an intensity of the blue light portion is greater than a CIE intensity of the same color temperature, and wherein an intensity of the green light portion is less than a CIE intensity of the same color temperature.

BRIEF DESCRIPTION OF THE DRAWINGS

A detailed description of the figures is given below. These show:

FIG. 1 shows a schematic representation of an LED module 100 according to one embodiment of the invention.

DETAILED DESCRIPTION

Figure 1:
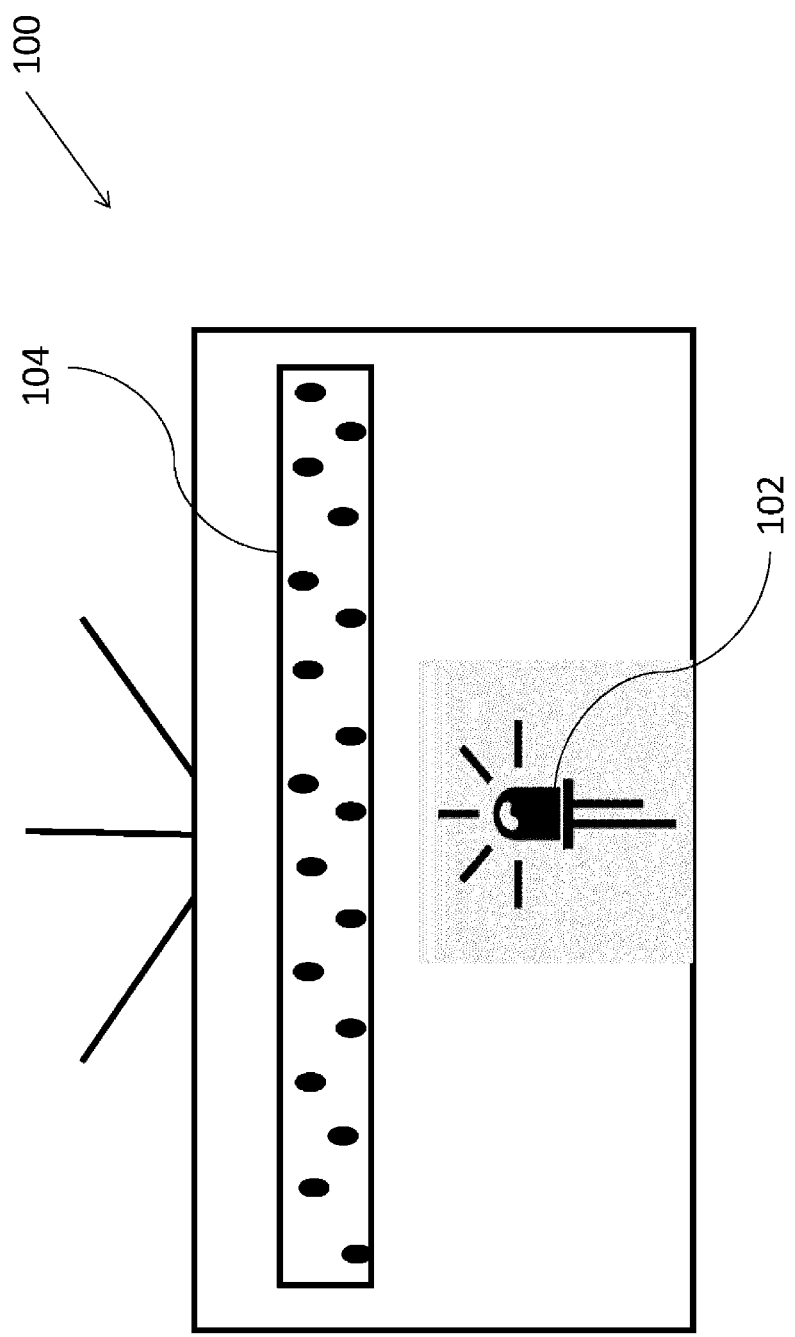
FIG. 1 a schematic representation of an LED module according to one embodiment of the invention.

The LED module 100 comprises an LED chip 102 which is designed to emit a radiation. For example, this radiation may comprise blue or violet light. The radiation preferably does not comprise UV radiation. The LED module 100 furthermore comprises at least one phosphor 104 which is suitable for converting the radiation of the LED chip 102 into a light, i.e., visible radiation.

An emission spectrum of the LED module 100 contains a blue light portion and a green light portion, wherein an intensity of the blue light portion is greater than a CRI intensity of the same color temperature, and wherein an intensity of the green light portion is less than a CIE intensity of the same color temperature. The emission spectrum of the LED module 100 can be generated by the radiation of the LED chip 102 and the light emitted by the at least one phosphor 104. The phosphor 104 can thus partially convert the radiation of the LED chip 102. A complete conversion of the radiation of the LED chip 102 into light is also conceivable.

The emission spectrum of the LED module 100 has the advantage that a lower emission spectral intensity is present in the short-wavelength range below 460 nm (which is potentially more harmful to the eye) and a higher intensity is present in the orange red wavelength range in comparison to the natural emission spectra, wherein the most important ranges in the comparison of the azure-blue to lime-green wavelength ranges are, according to the invention, those close to the natural emission spectrum.

Exemplary embodiments of the technical solutions according to the invention (lamp including optics or LED module 100 with/without optics) are based, for example, on an LED chip 102 which has a chip emission peak of 420-425 nm (violet), and wherein the light is remitted proportionately by a phosphor mixture or phosphor 104 by fluorescence effects. The LED module 100 may also contain a plurality of LED chips 102, and at least electromagnetic radiation from one LED chip 102 up to all LED chips 102 is converted by the at least one phosphor 104.

By means of an optical unit (e.g., reflector, lenses, diffusers, transparent or translucent materials or combinations of the like), a portion of the violet light of the LED chip 102 can, especially, be absorbed in order to achieve the described emission spectrum of the LED module 100.

The quantitative composition and the distribution of the phosphor 104 in the reception range of the violet light of the LED chip 102 can be designed in such a way that a light spectrum is generated overall which has the following properties when compared to natural light spectra (Planck up to 4800 K, above that CIE daylight spectra) on the basis of the same melanopic effect:

In the case of a CCT which is 1250 K to 1750 K lower than that of the compared natural light, the deviation from this natural emission spectrum in the emission spectral intensity in the range of 460-550 nm is at most ±15% at individual wavelengths.

The emission spectrum of the LED module 100 at a specific color temperature, preferably 4000 K, is substantially equal to, preferably within 10% of, preferably within 5% of, a standardized daylight spectrum according to CIE of a correlated color temperature at least 1250 kelvin higher.

The emission spectrum of the LED module 100 at the specific color temperature is substantially equal to, preferably within 10% of, preferably within 5% of, a standardized daylight spectrum according to CIE of a correlated color temperature no more than 1750 kelvin higher.

The color temperature of the standardized daylight spectrum is preferably in the range of 5300 K to 6000 K; it is particularly preferably 5700 K.

The emission spectrum of the LED module 100 at a color temperature of 4000 K is substantially equal to a standardized daylight spectrum according to CIE of a higher color temperature.

The profile of the compared emission spectra of different CCT here is almost parallel in this wavelength range of 460-550 nm, except for possible slight ripples. The emission spectral profile achieves a color rendering level of CRI>=90 and an R9 of approximately 50 or slightly higher. In addition, the photometric radiation equivalent of the emission spectrum of the LED module 100 at 4000 K exceeds a value of 290 lm/Wrad.

In this way, a light source (LED module 100) is advantageously generated which comes closer in the non-visual effect and surprisingly also in the visual effect of the daylight equivalent of higher color temperature.

Figure 2:
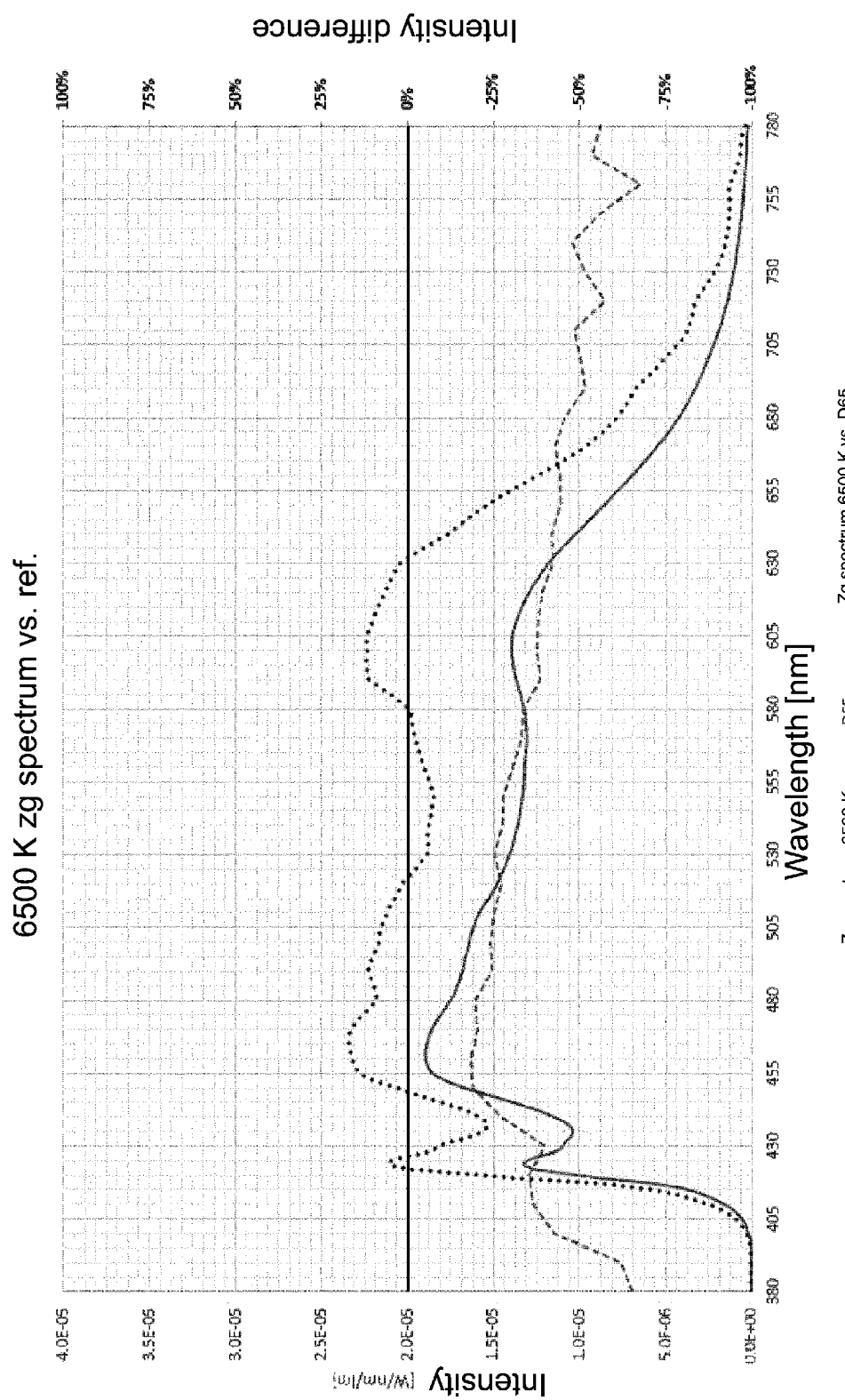
FIG. 2 various emission spectra at the same color temperature and their difference according to one embodiment of the invention.

FIG. 2 shows various emission spectra at the same color temperature and their difference according to one preferred embodiment of the invention.

An exemplary embodiment of an emission spectrum of an LED module 100 according to the invention is shown in FIG. 2. In FIG. 2, the profile of the reference emission spectrum of the CIE ("D65") and the emission spectrum ("zg spectrum") of an LED module 100 according to the invention according to one preferred exemplary embodiment are shown.

The reference emission spectrum of the CIE is illustrated in FIG. 2 by way of example with reference to the D65 profile for a light color of 6500 K. Instead of the D65 reference emission spectrum of the CIE, the invention can also be used for all other reference emission spectra of the CIE.

The emission spectrum of an LED module 100 according to the invention according to the example in FIG. 2 is characterized in that it has almost no emission in the range below a wavelength of 405 nm. In the range from 420 to 425, there is a first emission peak, but this first emission peak has a lower intensity than the second emission peak at approximately 460 nm and the third and emission peak at approximately 605 nm.

In the range between the emission at approximately 530 nm and the third emission peak at approximately 605 nm, the emission spectrum preferably has almost the same intensity as the value of the emission at approximately 530 nm.

According to an especially preferred variant, the intensity of the emission spectrum of the LED module 100 according to the invention in the range from 450 nm to 525 nm is above the profile of the D65 reference emission spectrum, i.e., there is an excessive intensity increase in this range in comparison to the D65 reference emission spectrum.

According to an especially preferred variant, the intensity of the emission spectrum of the LED module 100 according to the invention in the range from 525 nm to 580 nm is below the profile of the D65 reference emission spectrum, i.e., there is an intensity reduction in this range in comparison to the D65 reference emission spectrum.

According to an especially preferred variant, the intensity of the emission spectrum of the LED module 100 according to the invention in the range from 580 nm to 630 nm is above the profile of the D65 reference emission spectrum, i.e., there is an excessive intensity increase in this range in comparison to the D65 reference emission spectrum.

According to an especially preferred variant, the intensity of the emission spectrum of the LED module 100 according to the invention in the range of over 630 nm is below the profile of the D65 reference emission spectrum, i.e., there is an intensity reduction in this range in comparison to the D65 reference emission spectrum.

Figure 3:
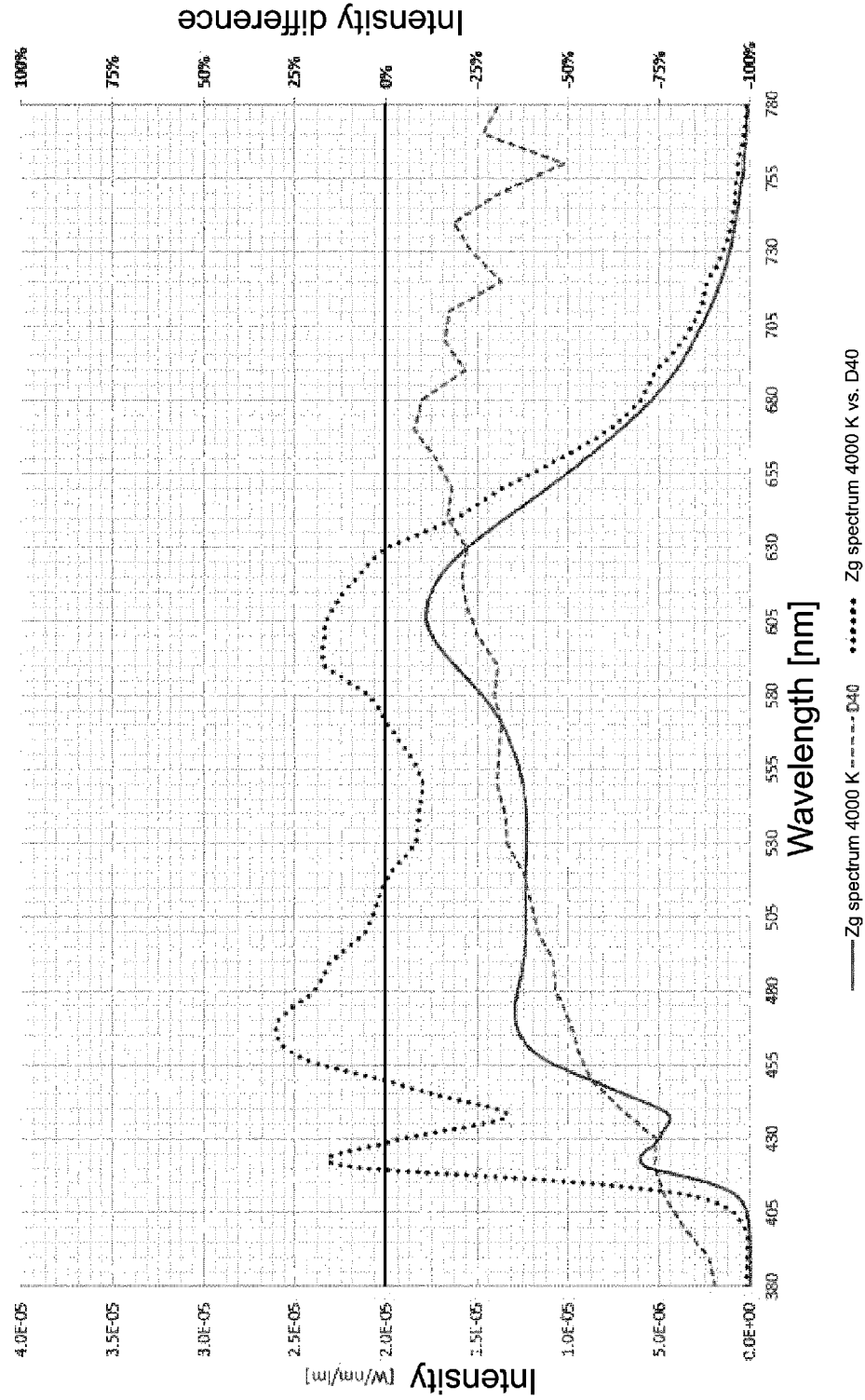
FIG. 3 various emission spectra at the same color temperature and their difference according to one embodiment of the invention.

FIG. 3 shows various emission spectra at the same color temperature and their difference according to one preferred embodiment of the invention;

An exemplary embodiment of an emission spectrum of an LED module 100 according to the invention is shown in FIG. 3. In FIG. 3, the profile of the reference emission spectrum of the CIE ("D40") and the emission spectrum ("ZG spectrum") of an LED module 100 according to the invention according to one preferred exemplary embodiment are shown.

The reference emission spectrum of the CIE is illustrated in FIG. 3 by way of example with reference to the D40 profile for a light color of 4000 K. Instead of the D40 reference emission spectrum of the CIE, the invention can also be used for all other reference emission spectra of the CIE.

The emission spectrum of an LED module 100 according to the invention according to the example in FIG. 3 is characterized in that it has almost no emission in the range below a wavelength of 405 nm. In the range from 420 to 425, there is a first emission peak, but this first emission peak has a lower intensity than the second emission peak at approximately 470 nm, and the third and emission peak at approximately 605 nm.

The emission spectrum in the range between the second emission peak at approximately 470 nm and the emission at approximately 555 nm preferably has almost a stable emission close to the value of the second emission peak at approximately 470 nm.

According to an especially preferred variant, the intensity of the emission spectrum of the LED module 100 according to the invention in the range from 450 nm to 515 nm is above the profile of the D40 reference emission spectrum, i.e., there is an excessive intensity increase in this range in comparison to the D40 reference emission spectrum.

According to an especially preferred variant, the intensity of the emission spectrum of the LED module 100 according to the invention in the range from 515 nm to 570 nm is below the profile of the D40 reference emission spectrum, i.e., there is an intensity reduction in this range in comparison to the D40 reference emission spectrum.

According to an especially preferred variant, the intensity of the emission spectrum of the LED module 100 according to the invention in the range from 570 nm to 630 nm is above the profile of the D40 reference emission spectrum, i.e., there is an excessive intensity increase in this range in comparison to the D40 reference emission spectrum.

According to an especially preferred variant, the intensity of the emission spectrum of the LED module according to the invention in the range of over 630 nm is below the profile of the D40 reference emission spectrum, i.e., there is an intensity reduction in this range in comparison to the D40 reference emission spectrum.

Figure 4:
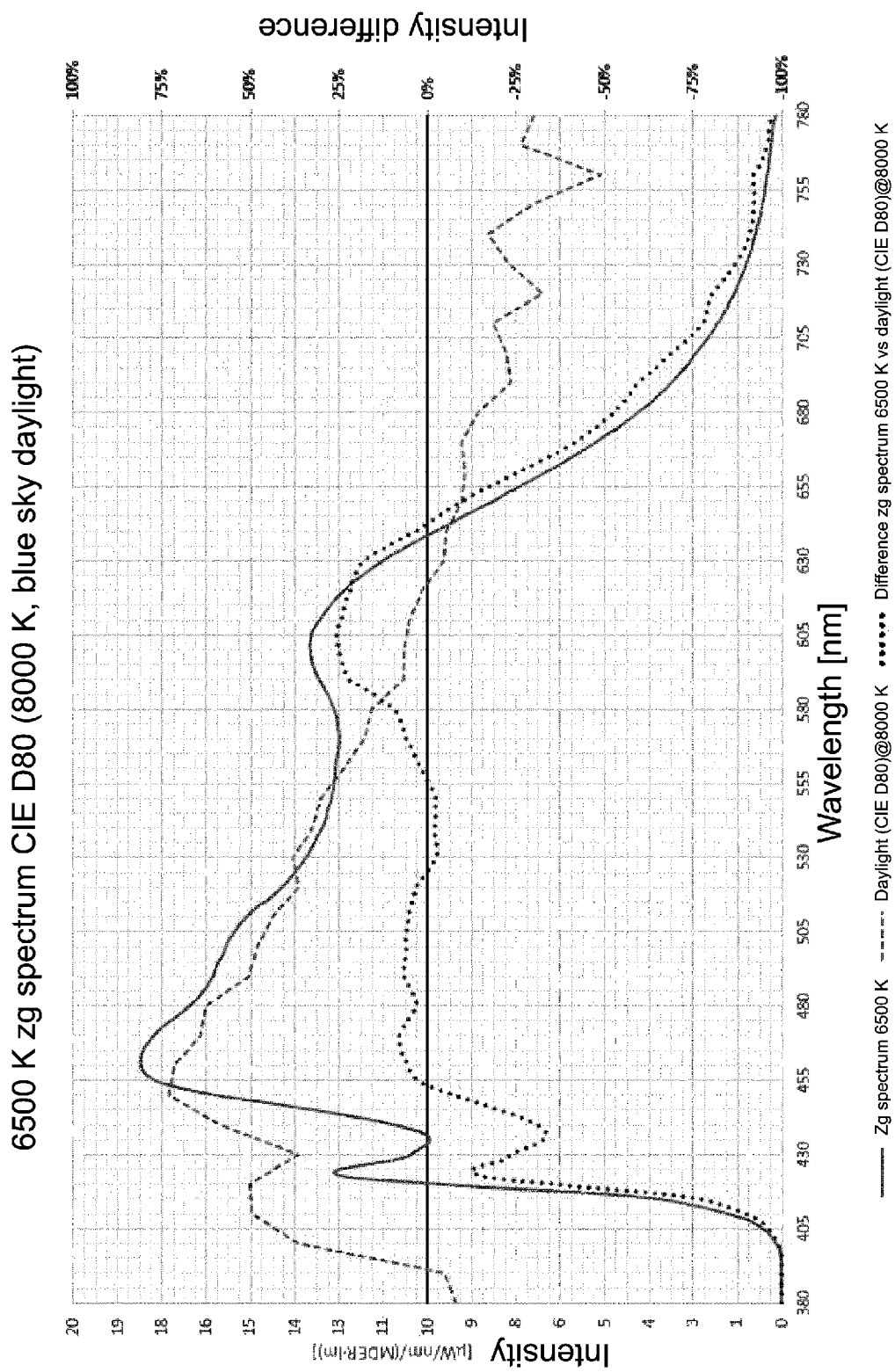
FIG. 4 various emission spectra at a different color temperature and their difference according to one embodiment of the invention.

FIG. 4 shows various emission spectra at different color temperatures and their difference according to one preferred embodiment of the invention.

An exemplary embodiment of an emission spectrum of an LED module 100 according to the invention is shown in FIG. 4. In FIG. 4, the profile of the reference emission spectrum of the CIE ("D80") and the emission spectrum ("zg spectrum") of an LED module 100 according to the invention according to one preferred exemplary embodiment are shown.

Figure 5:
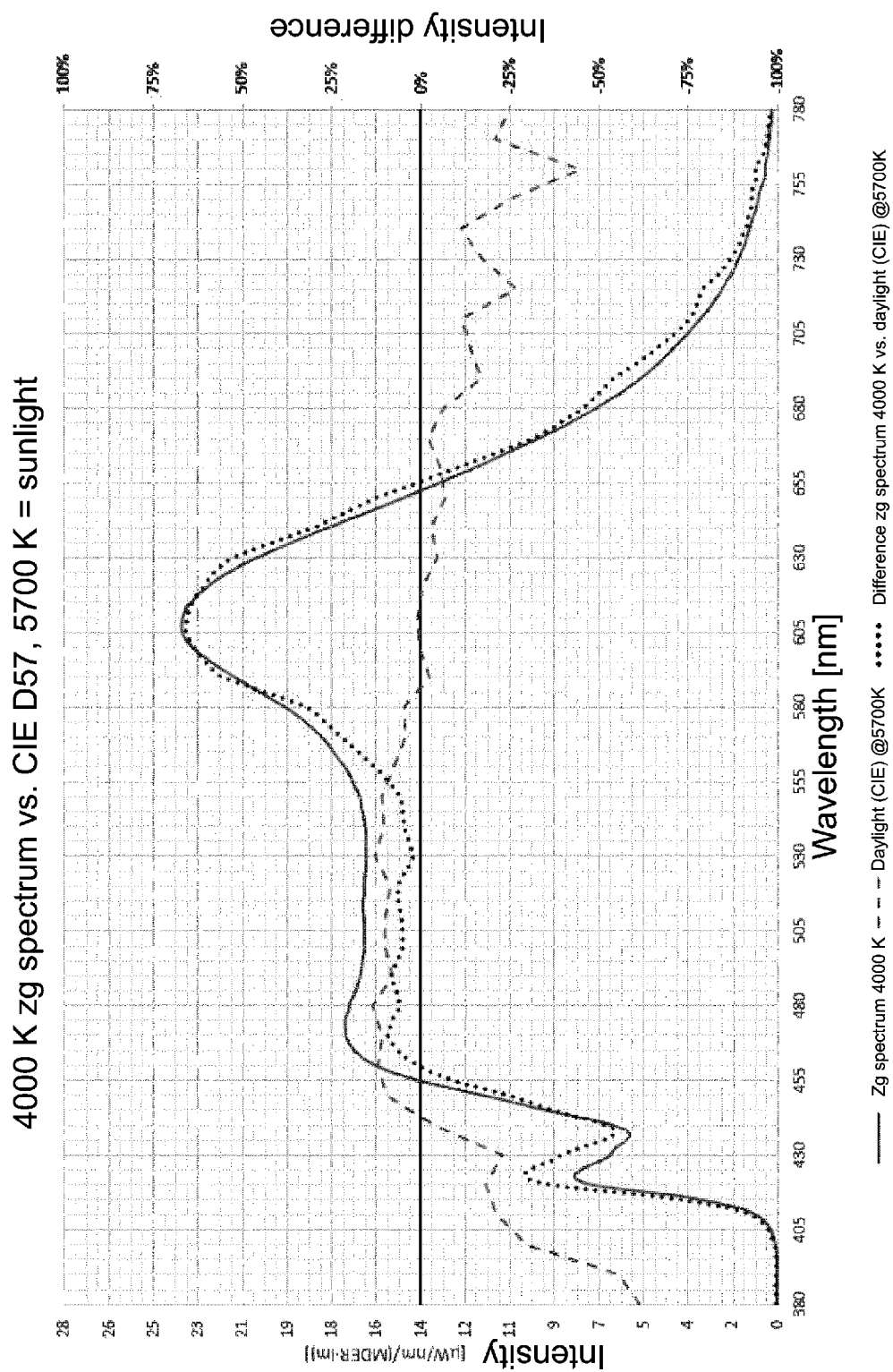
FIG. 5 various emission spectra at a different color temperature and their difference according to one embodiment of the invention.

The reference emission spectrum of the CIE is illustrated in FIG. 5 by way of example with reference to the D80 profile for a light color of 8000 K. Instead of the D80 reference emission spectrum of the CIE, the invention can also be used for other reference emission spectra of the CIE in the range of CCTs that are 1250 K to 1750 K higher.

The emission spectrum of an LED module 100 according to the invention according to the example in FIG. 5 is characterized in that it has almost no emission in the range below a wavelength of 400 nm. In the range from 420 to 425, there is a first emission peak, but this first emission peak has a lower intensity than the second emission peak at approximately 460 nm and the third and emission peak at approximately 605 nm.

In the present comparison of the emission spectra, the melanopic, i.e., non-visual, effects of the two spectra are used as a basis of comparison instead of the luminous flux.

According to an especially preferred variant, the intensity of the emission spectrum of the LED module 100 according to the invention in the range from 380 nm to 450 nm is below the profile of the D80 reference emission spectrum, i.e., there is an intensity reduction in this range in comparison to the D80 reference emission spectrum.

According to an especially preferred variant, the intensity of the emission spectrum of the LED module according to the invention in the range from 450 nm to 525 nm is above the profile of the D80 reference emission spectrum, i.e., there is an excessive intensity increase in this range in comparison to the D80 reference emission spectrum.

According to an especially preferred variant, the intensity of the emission spectrum of the LED module 100 according to the invention in the range from 525 nm to 555 nm is below the profile of the D80 reference emission spectrum, i.e., there is an intensity reduction in this range in comparison to the D80 reference emission spectrum.

According to an especially preferred variant, the intensity of the emission spectrum of the LED module 100 according to the invention in the range from 555 nm to 640 nm is above the profile of the D80 reference emission spectrum, i.e., there is an excessive intensity increase in this range in comparison to the D80 reference emission spectrum.

According to an especially preferred variant, the intensity of the emission spectrum of the LED module according to the invention in the range of over 640 nm is below the profile of the D80 reference emission spectrum, i.e., there is an intensity reduction in this range in comparison to the D80 reference emission spectrum.

A preferred embodiment has a very small deviation (preferably within 15%) of the two spectra in the range 460 nm to 550 nm because this range is of particular importance for the non-visual effects.

FIG. 5 shows various emission spectra at different color temperatures and their difference according to one preferred embodiment of the invention.

An exemplary embodiment for an emission spectrum of an LED module 100 according to the invention is shown in FIG. 5. In FIG. 5, the profile of the reference emission spectrum of the CIE ("Daylight") and the emission spectrum ("zg spectrum") of an LED module 100 according to the invention according to one preferred exemplary embodiment are shown.

The reference emission spectrum of the CIE is illustrated in FIG. 5 by way of example with reference to the "Daylight" profile for a light color of 5700 K. Instead of the reference emission spectrum of the CIE, the invention can also be used for all other reference emission spectra of the CIE.

The emission spectrum "zg spectrum" of an LED module 100 according to the invention according to the example in FIG. 5 is characterized in that it has almost no emission in the range below a wavelength of 405 nm. In the range from 420 to 425, there is a first emission peak, but this first emission peak has a lower intensity than the second emission peak at approximately 470 nm, and the third emission peak at approximately 605 nm.

According to an especially preferred variant, the intensity of the emission spectrum of the LED module according to the invention in the range from 380 nm to 460 nm is below the profile of the reference emission spectrum, i.e., there is an intensity reduction in this range in comparison to the reference emission spectrum.

Preferably, the emission spectrum has almost a stable emission close to the value of the first emission peak in the range between the second emission peak at approximately 470 nm and 555 nm.

According to an especially preferred variant, the intensity of the emission spectrum of the LED module 100 according to the invention in the range from 460 nm to 655 nm is above the profile of the reference emission spectrum, i.e., there is an excessive intensity increase in this range in comparison to the reference emission spectrum.

According to an especially preferred variant, the intensity of the emission spectrum of the LED module 100 according to the invention in the range of over 655 nm is below the profile of the reference emission spectrum, i.e., there is an intensity reduction in this range in comparison to the reference emission spectrum.

A preferred embodiment has a very small deviation (preferably within 15%) of the two spectra in the range 460 nm to 550 nm because this range is of particular importance for the non-visual effects.

Figure 6:
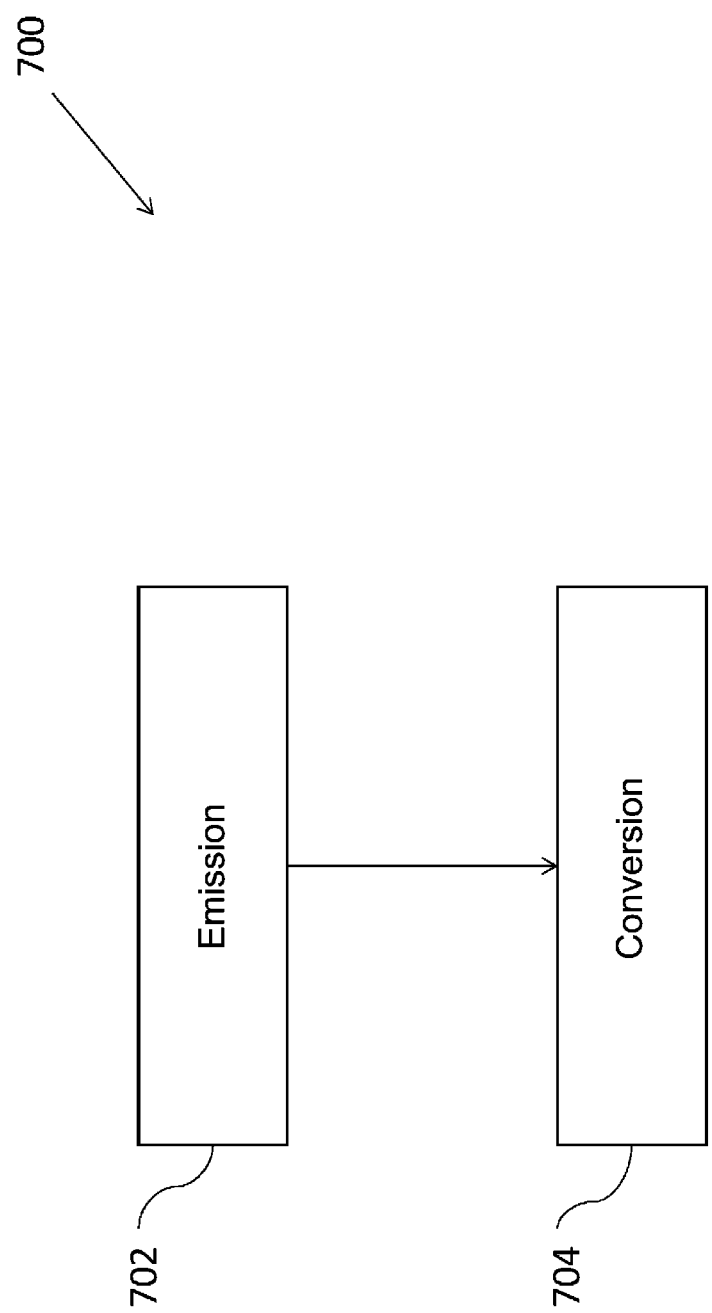
FIG. 6 a method for an LED module according to one embodiment of the invention.

FIG. 6 shows a method 700 for an LED module 100 according to one preferred embodiment of the invention.

The method 700 for an LED module 100 comprises the following steps:

Emitting 702 a radiation (by means of an LED chip 102);

Converting 704 the radiation of the LED chip 102 into a light (through at least one phosphor), wherein an emission spectrum of the LED module 100 contains a blue light portion and a green light portion, wherein an intensity of the blue light portion is greater than a CIE intensity of the same color temperature, and wherein an intensity of the green light portion is less than a CIE intensity of the same color temperature.

On the one hand, this emission spectrum of the LED module 100 can be generated directly by a dye-converted LED chip 102.

On the other hand, the desired emission spectrum can be not only the result of a dye-converted LED chip 102 itself but also the result of the interaction of this light source (LED chip 102 and phosphor(s)) with the optical properties of a lamp, which can, for example, reduce the violet portion of the primary excitation.

The invention claimed is:

1. An LED module (100) comprising:
   at least one LED chip (102) which is designed to emit electromagnetic radiation;
   at least one phosphor (104) which is suitable for converting the radiation of the LED chip (102) into a light, wherein
   an emission spectrum of the LED module (100) contains a blue light portion and a green light portion, wherein
   an intensity of the blue light portion at each wavelength is greater than an intensity of the comparable CRI (color rendering) reference spectrum according to CIE recommendation at the same color temperature, and wherein
   an intensity of the green light portion at each wavelength is less than an intensity of the comparable CRI (color rendering) reference spectrum according to CIE recommendation at the same color temperature.

2. The LED module (100) according to claim 1,
   wherein the at least one phosphor (104) is designed to at least partially absorb the electromagnetic radiation of the LED chip (102) and to emit light in a different wavelength range than the electromagnetic radiation, wherein the emission spectrum of the LED module (100) is generated by mixing the radiation of the LED chip (102) and the light emitted by the phosphor (104).

3. The LED module (100) according to claim 1,
   wherein the LED module (100) comprises a translucent material for protecting the LED chip, where said translucent cover is a globe top and contains the at least one phosphor (104).

4. The LED module (100) according to claim 1,
   wherein the LED chip (102) emits the electromagnetic radiation in a violet wavelength range, and has no UV portion below 400 nm, and the LED module does not emit light with a wavelength below 400 nm.

5. The LED module (100) according to claim 1, wherein the emission spectrum of the LED module (100) shows no upwardly outlying peak in a range from 460 nm to 550 nm.

6. The LED module (100) according to claim 1, wherein the emission spectrum of the LED module (100) at a specific color temperature of 4000 K is substantially equal to, or within 10% of, a standardized daylight spectrum according to CIE of a correlated color temperature at least 1250 K higher.

7. The LED module (100) according to claim 6, wherein the emission spectrum of the LED module (100) at the specific color temperature is substantially equal to a standardized daylight spectrum according to CIE of a correlated color temperature no more than 1750 kelvin higher.

8. The LED module (100) according to claim 6, wherein the emission spectrum of the LED module (100) is close to the daylight spectrum at 5700 K and in a wavelength range from 460 nm to 550 nm.

9. The LED module (100) according to claim 1, wherein the color temperature of the standardized daylight spectrum is 5700 K.

10. The LED module (100) according to claim 1, wherein the emission spectrum of the LED module (100) at a color temperature of 4000 K is substantially equal to a standardized daylight spectrum according to CIE of a higher color temperature.

11. The LED module (100) according to claim 1 wherein an intensity of the LED chip emission spectrum is below an intensity of the daylight spectrum at identical color temperature.

12. The LED module (100) according to claim 1 , wherein a color rendering index CRI of the LED module (100) is above 90.

13. The LED module (100) according to claim 1, wherein the emission spectrum of the LED module (100) is generated by a dye-converted LED containing the LED chip and the at least one phosphor (104).

14. The LED module (100) according to claim 1, wherein the emission spectrum of the LED module (100) is generated by combining a dye-converted LED, containing the LED chip (102) and the at least one phosphor, and optical properties of a lamp.

15. The LED module (100) according to claim 1, wherein an intensity of the electromagnetic radiation of the LED chip (102) can be changed by amplitude or pulse-width modulation.

16. The LED module (100) according to claim 1, wherein the wavelength of the electromagnetic radiation of the LED chip (102) can be changed via a forward current.

17. The LED module (100) according to claim 1, wherein a first emission peak of the emission spectrum of the LED module, which has a lower intensity than a second emission peak of the emission spectrum at approximately 460 nm, is in a range from 410 nm to 430 nm.

18. The LED module (100) according to claim 17, wherein a third emission peak of the emission spectrum, which has a greater intensity than the first emission peak of the emission spectrum, is at approximately 605 nm.

19. The LED module (100) according to claim 17, wherein a third emission peak of the emission spectrum, which has a lesser or a greater intensity than the second emission peak of the emission spectrum, is at approximately 605 nm.

20. A method (700) for an LED module (100), comprising:
emitting (702) electromagnetic radiation with an LED chip (102);
converting (704) the electromagnetic radiation of the LED chip (102) into a light at a given color temperature, wherein an emission spectrum of the LED module (100) contains a blue light portion and a green light portion, wherein an intensity of the blue light portion at each wavelength is greater than an intensity of the comparable CRI (color rendering) reference spectrum according to CIE recommendation at the same color temperature, wherein an intensity of the green light portion at each wavelength is less than a CIE intensity of the same color temperature and further wherein the emission spectrum of the LED module (100) is within 10% of a standardized daylight spectrum according to CIE at a higher color temperature.

* * * * *